US012757442B2

(12) United States Patent
Park et al.

(10) Patent No.: US 12,757,442 B2
(45) Date of Patent: Oct. 6, 2026

(54) THIN FILM TRANSISTOR SUBSTRATE AND DISPLAY APPARATUS COMPRISING THE SAME

(71) Applicant: LG Display Co., Ltd., Seoul (KR)

(72) Inventors: Jaeyoon Park, Paju-si (KR); Jinwon Jung, Paju-si (KR); Hyeonjoo Seul, Paju-si (KR); Sungju Choi, Paju-si (KR); Dongyeon Kang, Paju-si (KR)

(73) Assignee: LG Display Co., Ltd., Seoul (KR)

(*) Notice: Subject to any disclaimer, the term of this patent is extended or adjusted under 35 U.S.C. 154(b) by 359 days.

(21) Appl. No.: 18/380,497

(22) Filed: Oct. 16, 2023

(65) Prior Publication Data

US 2024/0222452 A1 Jul. 4, 2024

(30) Foreign Application Priority Data

Dec. 29, 2022 (KR) ........................ 10-2022-0189069

(51) Int. Cl.
*H01L 29/417* (2006.01)
*G09G 3/3266* (2016.01)
(Continued)

(52) U.S. Cl.
CPC ....... *H10D 30/6729* (2025.01); *G09G 3/3266* (2013.01); *G09G 3/3275* (2013.01);
(Continued)

(58) Field of Classification Search
CPC ........... H10D 30/6729; H10D 30/6757; H10D 30/67; H10D 86/451; H10D 86/60; H10D 86/441; H10D 64/20; H10D 30/6715; H10D 30/6755; H10D 84/0135–0142; H10D 84/0172–0179; H10D 64/311–519; H10D 30/673–6736; H10D 64/66–693; H10D 30/0215; H10D 64/017;
(Continued)

(56) References Cited

U.S. PATENT DOCUMENTS 5,612,565 A 3/1997 Kusumoto
6,127,211 A 10/2000 Hirao et al.
(Continued)

FOREIGN PATENT DOCUMENTS

JP H07-162010 A 6/1995
JP H08-116063 A 5/1996
(Continued)

OTHER PUBLICATIONS

Office Action issued Nov. 13, 2024 for Japanese Patent Application No. 2023-197973.

(Continued)

*Primary Examiner* — Cuong B Nguyen
(74) *Attorney, Agent, or Firm* — Morgan, Lewis & Bockius LLP

(57) ABSTRACT

A thin film transistor substrate includes a substrate; an active layer on the substrate; a gate electrode on the active layer; a source electrode connected to a first side of the active layer, and a drain electrode connected to a second side of the active layer. The gate electrode includes a body portion and at least one first protrusion on a first side of the body part with the at least one first protrusion overlapping the active layer in a plan view.

22 Claims, 9 Drawing Sheets

(51) Int. Cl.
*G09G 3/3275* (2016.01)
*H10D 30/67* (2025.01)

(52) U.S. Cl.
CPC ....... *H10D 30/673* (2025.01); *H10D 30/6757* (2025.01); *G09G 2310/0286* (2013.01)

(58) Field of Classification Search
CPC ............... H10D 30/701; H10D 64/605; H10D 64/665–669; H10D 64/01312; H10D 64/01313; H10D 64/0132; G09G 3/3266; G09G 3/3275; G09G 2310/0286; H10K 59/1213; H10B 51/00–50; H10P 14/412–414
See application file for complete search history.

(56) References Cited

U.S. PATENT DOCUMENTS

| | | | |
|---|---|---|---|
| 8,988,626 | B2 | 3/2015 | Lee |
| 2003/0222308 | A1 | 12/2003 | Su et al. |
| 2004/0145018 | A1 | 7/2004 | Inoue et al. |
| 2005/0110090 | A1 | 5/2005 | Koo et al. |
| 2006/0284550 | A1 | 12/2006 | Takeguchi et al. |
| 2011/0057918 | A1 | 3/2011 | Kimura et al. |
| 2019/0074377 | A1* | 3/2019 | Park .................. H10D 30/6755 |
| 2022/0085071 | A1 | 3/2022 | Choi et al. |
| 2022/0320269 | A1 | 10/2022 | Gui et al. |

FOREIGN PATENT DOCUMENTS

| | | | |
|---|---|---|---|
| JP | H10-116990 | A | 5/1998 |
| JP | H10-154813 | A | 6/1998 |
| JP | H11-168221 | A | 6/1999 |
| JP | 2004-153285 | A | 5/2004 |
| JP | 2007-005395 | A | 1/2007 |
| JP | 2010-171163 | A | 8/2010 |
| KR | 10-2006-0036005 | A | 4/2006 |
| WO | 2017/164904 | A1 | 9/2017 |

OTHER PUBLICATIONS

Ipri, et al., "The Application of Silicon-on-Insulator (SOI) Technology for the Fabrication of Fully Scanned Active Matrix Flat Panel Displays" , Oct. 1994, Proceedings 1994 IEEE International SOI Conference, pp. 97-98.
GB search report issued in corresponding GB Patent Application No. 2313251.7 dated Feb. 12, 2024.

* cited by examiner

THIN FILM TRANSISTOR SUBSTRATE AND DISPLAY APPARATUS COMPRISING THE SAME

CROSS-REFERENCE TO RELATED APPLICATIONS

This application claims the benefit of the Korean Patent Application No. 10-2022-0189069 filed on Dec. 29, 2022, which is hereby incorporated by reference as if fully set forth herein.

BACKGROUND

Technical Field

The present disclosure relates to a thin film transistor substrate and a display apparatus comprising the same.

Discussion of the Related Art

Because a thin film transistor may be fabricated on a glass substrate or a plastic substrate, the thin film transistor is widely used as a switching device or as a driving device of a display apparatus, such as a liquid crystal display apparatus or an organic light emitting display apparatus. Various types of thin film transistors, such as display area thin film transistors for individual pixels that emit light, Logic-GIP thin film transistors to control display area thin film transistors, and Buffer-GIP thin film transistors to control the overall power supply, can be used for display panels to drive an organic light emitting device.

To implement a device having high mobility in a thin film transistor having a top gate structure, a conducting process (also referred to as a conductorizing process) of an oxide semiconductor layer may be performed using a gate electrode as a mask. However, during the conducting process of the oxide semiconductor layer, the channel region may be formed smaller than the set region due to excessive penetration of the conducting region, thereby reducing the channel length and shifting the threshold voltage Vth in the negative (−) direction. In particular, when the width of the oxide semiconductor layer is large, the degree of penetration of the region to be conducted increases, and thus the channel length may be further shortened.

When the threshold voltage Vth is shifted in a negative (−) direction, a leakage current may be generated in the initial image. As a result, a panel including a thin film transistor may be defective in driving due to the leakage current, and a problem of increasing power consumption of the panel may occur.

SUMMARY

Accordingly, embodiments of the present disclosure are directed to a thin film transistor substrate and a display apparatus comprising the same that substantially obviates one or more of the problems due to limitations and disadvantages of the related art.

An aspect of the present disclosure is to provide a thin film transistor substrate and a display apparatus including the same that can suppress negative shift of threshold voltage Vth by preventing channel length from decreasing when conducting an oxide semiconductor layer.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a thin film transistor substrate comprises a substrate; an active layer on the substrate; a gate electrode on the active layer; a source electrode connected to a first side of the active layer; and a drain electrode connected to a second side of the active layer, wherein the gate electrode includes a body portion and at least one first protrusion on a first side of the body part, the at least one first protrusion overlapping the active layer in a plan view.

In another aspect, a display apparatus comprises a thin film transistor substrate including a substrate, an active layer on the substrate, a gate electrode on the active layer, a source electrode to a first side of the active layer, and a drain electrode to a second side of the active layer, wherein the gate electrode includes a body portion and at least one first protrusion on a first side of the body portion, the at least one first protrusion overlapping the active layer; and a gate driver and a data driver connected to the thin film transistor substrate to supply gate signals and data signals, respectively, to the thin film transistor substrate.

It is to be understood that both the foregoing general description and the following detailed description are exemplary and explanatory and are intended to provide further explanation of the inventive concepts as claimed

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings:

FIG. 5B is a cross-sectional view taken along line II-II' of FIG. 5A.

DETAILED DESCRIPTION

Figure 1A:
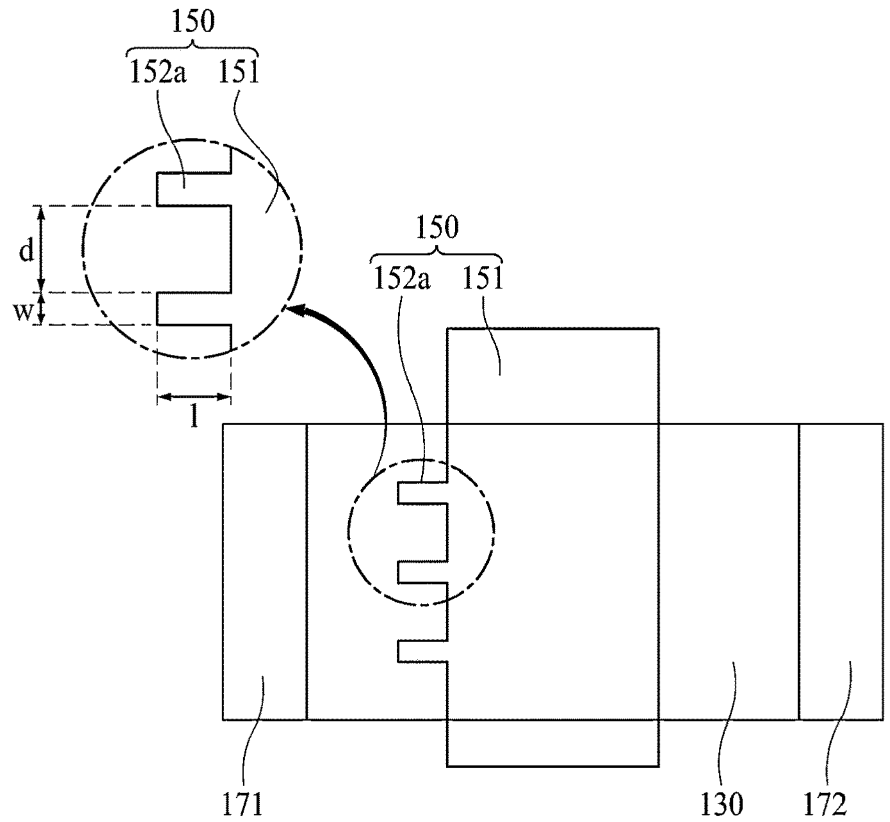
FIGS. 1A and 1B are plan views of a thin film transistor substrate according to an embodiment of the present disclosure.

Advantages and features of the present disclosure, and implementation methods thereof will be clarified through the following embodiments, described with reference to the accompanying drawings. The present disclosure may, however, be embodied in different forms and should not be construed as being limited to the embodiments set forth herein. Rather, these embodiments are provided so that this disclosure will be thorough and complete, and will fully convey the scope of the present disclosure to those skilled in the art. Further, the present disclosure is only defined by the scope of the claims.

The shapes, sizes, ratios, angles, and numbers disclosed in the drawings for describing embodiments of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case in which "comprise," "have," and "include" described in the present specification are used, another part may also be present unless "only" is used. The terms in a singular form may include plural forms unless noted to the contrary.

In construing an element, the element is construed as including an error region although there is no explicit description thereof.

In describing a positional relationship, for example, when the positional order is described as "on," "above," "below," "beneath", and "next," the case of no contact therebetween may be included, unless "just" or "direct" is used.

If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically. The embodiments of the present disclosure may be carried out independently from each other, or may be carried out together in a co-dependent relationship.

In the drawings, the same or similar elements are denoted by the same reference numerals even though they are depicted in different drawings.

In the embodiments of the present disclosure, a source electrode and a drain electrode are distinguished from each other, for convenience of explanation. However, the source electrode and the drain electrode are used interchangeably. Thus, the source electrode may be the drain electrode, and the drain electrode may be the source electrode. Also, the source electrode in any one embodiment of the present disclosure may be the drain electrode in another embodiment of the present disclosure, and the drain electrode in any one embodiment of the present disclosure may be the source electrode in another embodiment of the present disclosure.

In one or more embodiments of the present disclosure, for convenience of explanation, a source region is distinguished from a source electrode, and a drain region is distinguished from a drain electrode. However, embodiments of the present disclosure are not limited to this structure. For example, a source region may be a source electrode, and a drain region may be a drain electrode. Also, a source region may be a drain electrode, and a drain region may be a source electrode.

Figure 1B:
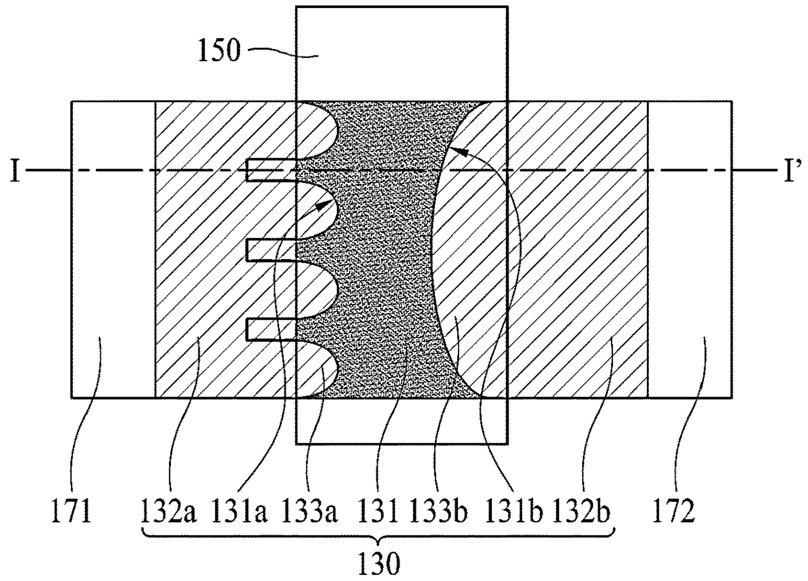

FIGS. 1A and 1B are plan views of a thin film transistor substrate according to an embodiment of the present disclosure. In this case, FIG. 1A illustrates a state before performing a conducting process on the active layer 130, and FIG. 1B illustrates a state in which the active layer 130 includes a channel part 131, a first connection part 132*a* (or source area), and a second connection part 132*b* (or drain area) by performing a conducting process on the active layer 130.

As shown in FIGS. 1A and 1B, the thin film transistor substrate according to an embodiment of the present disclosure includes an active layer 130, a gate electrode 150 overlapping the active layer 130, a source electrode 171 provided on one side of the active layer 130, and a drain electrode 172 provided on the other side of the active layer 130. The active layer 130 may extend in a first direction, for example, a horizontal direction, and the gate electrode 150 may extend in a second direction, for example, a vertical direction, but is not limited thereto.

The thin film transistor according to the present disclosure may have a top gate structure in which the gate electrode 150 is provided on the active layer 130, and in the top gate structure, a conducting process may be performed on a partial area of the active layer 130 not covered by the gate electrode 150 using the gate electrode 150 as a mask. Through the conducting process, the active layer 130 may include a channel part 131, a first connection part 132*a*, and a second connection part 132*b*.

The conducting process (alternatively termed as a conductorizing process) refers to a process of increasing an electron concentration in a partial region of the active layer 130 made of an oxide semiconductor, for example, a plasma treatment process or a process of doping dopant ions in a process of etching a gate insulating layer. When the conducting process is performed, the electron concentration of a portion of the active layer 130 increases, and thus conductive characteristics are increased, thereby having the same characteristics as conductors. When the conducting process is proceeded with a process of doping dopant ions, the dopant ions can be boron B, phosphorus P, fluorine F, and hydrogen H.

According to an embodiment of the present disclosure, a conducting process using the gate electrode 150 as a mask, for example, a dopant ion doping process may be performed. In this case, the active layer 130 may include a region overlapping the gate electrode 150 and not doped with a dopant, for example, a channel part 131 and a region not overlapping the gate electrode 150 and doped with a dopant, for example, a first connection part 132*a* and a second connection part 132*b*. Meanwhile, the conducting process is not limited to a dopant doping process, and may include a conducting process by plasma treatment.

When the conducting process is performed, dopant ions may be diffused into the active layer 130 overlapping the gate electrode 150. Therefore, a part of the active layer 130 that does not overlap the gate electrode 150 is doped with dopant ions to form parts of the first connection part 132*a* and the second connection part 132*b*. In addition, dopant ions may be doped on a part of the active layer 130 overlapping the gate electrode 150 to form the remaining parts of the first connection part 132*a* and the second connection part 132*b*, for example a first convex part 133*a* and a second convex part 133*b*.

If the thin film transistor substrate includes only the body part 151 of the gate electrode 150 without the first protrusion 152*a*, the size of the first convex part 133*a* may increase due to the degree of diffusion of dopant ions into the active layer 130 overlapping the gate electrode 150 during the conducting process. This may, as a result, be a factor in which the length of the channel part 131 becomes too short.

If the length of the channel part 131 is too short, the threshold voltage Vth may be shifted in a negative (−) direction, and thus a leakage current may flow through the thin film transistor substrate including the active layer 130. When the leakage current flows, the switch function of the thin film transistor may not operate normally, and an error may occur in the quality of the initial image. Therefore, to prevent the threshold voltage Vth from being shifted in the negative (−) direction, the length of the channel part 131 may be controlled not to be short.

According to an embodiment of the present disclosure, because the gate electrode 150 has the first protrusion 152*a* on one side of the body part 151, the amount of dopant diffused into the active layer 130 overlapping the gate electrode 150 may be reduced. This may prevent the first convex part 133*a* from being large in size by preventing the dopant from diffusing into the active layer 130 overlapping the gate electrode 150. Thus, according to an embodiment of the present disclosure, the size of the first convex part 133*a* may be reduced, thereby suppressing the length of the channel part 131 from being excessively short.

Hereinafter, configurations of the gate electrode 150 and the active layer 130 according to an embodiment of the present disclosure will be described in more detail.

The body part 151 of the gate electrode 150 may overlap the active layer 130, particularly, the channel part 131, and may extend in the second direction.

As an example of one side of the body part 151, at least one first protrusion 152*a* is provided at one side of the body part 151, for example, the left side facing a source electrode 171. The at least one first protrusion 152*a* extends from the body part 151 in the first direction, particularly toward the source electrode 171. Meanwhile, a separate protrusion may not be provided on the other side of the body part 151, for example, the right side facing a drain electrode 172.

Accordingly, one side and the other side of the gate electrode 150 may be asymmetrically formed with respect to the body part 151. However, the structure of the gate electrode 150 is not limited thereto, and as shown in the embodiment in accordance with FIG. 5A, a protrusion may be formed on the other side of the body part 151.

The body part 151 and the at least one first protrusion 152*a* may be used as a mask in the process of conducting a partial region of the active layer 130. At this time, because at least one first protrusion 152*a* is provided on one side of the body part 151 and the other side of the body part 151 is not provided with a separate protrusion, the conductive region of the active layer 130 may be formed asymmetrically with respect to the channel part 131.

A region of the active layer 130 not covered by the body part 151 and the first protrusion 152*a* is conductive to form a first connection part 132*a* and a second connection part 132*b*. The first connection part 132*a* is provided on the left side of the unconducted channel part 131, and the second connection part 132*b* is provided on the right side of the unconducted channel part 131.

Meanwhile, the active layer 130 covered by the body part 151 and the first protrusion 152*a* should not be conductive, but for example, when the process is actually performed, doped dopant ions diffuse into a part of the active layer 130 covered by the body part 151 and the first protrusion 152*a*. For example, the region of the active layer 130 overlapping the first protrusion 152*a* is conductive to form the first connection part 132*a*.

In addition, a partial region of the active layer 130 overlapping the body part 151 is conductive to form the first convex part 133*a* and the second convex part 133*b* of the active layer 130.

The first convex part 133*a* overlaps the left end of the body part 151, and the second convex part 133*b* overlaps the right end of the body part 151. At this time, because a plurality of first protrusions 152*a* are provided on the left side of the body part 151, a plurality of first convex parts 133*a* are formed in a region overlapping the left end of the body part 151. On the other hand, because the first protrusion 152*a* is not provided on the right side of the body part 151, one second convex part 133*b* is formed in a region overlapping the right end of the body part 151.

Meanwhile, the channel part 131 of the active layer 130 corresponds to a non-conducting area except for the first connection part 132*a*, the second connection part 132*b*, the first convex part 133*a*, and the second convex part 133*b*. In this case, the horizontal length of the channel part 131 is reduced by the first convex part 133*a* and the second convex part 133*b*. However, according to an embodiment of the present disclosure, because the gate electrode 150 includes the first protrusion 152*a*, the horizontal length of the channel part 131 extending in the left-right direction in the region overlapping the first protrusion 152*a* is relatively increased.

For example, because the plurality of first protrusions 152*a* are provided, a region to be conducted, for example, a region in which dopant ions are diffused, is reduced, and thus the size of the first convex part 133*a* is relatively reduced. Accordingly, the size of the first convex part 133*a* is formed to be smaller than the size of the second convex part 133*b*. Accordingly, the length of the channel part 131 is relatively increased in a region where the first convex part 133*a* is formed.

In addition, because the first protrusion 152*a* is provided, the active layer 130 may not be conductive in the region between the plurality of first convex parts 133*a*. Accordingly, the length of the channel part 131 is relatively increased in a region between the plurality of first convex parts 133*a*.

As a result, due to the plurality of first protrusions 152*a* provided at one side, for example, the left side of the body part 151, the plurality of first convex parts 133*a* may be spaced apart from each other by a predetermined gap and may be formed in the first connection part 132*a*, and the horizontal length of the channel part 131 may be relatively increased.

When the length of the channel part 131 is relatively increased, the length of the channel part 131 is prevented from being too short, and thus it is possible to reduce the problem that the threshold voltage Vth of the thin film transistor is shifted in a negative (−) direction.

Hereinafter, referring to the enlarged drawing indicated by an arrow in FIG. 1A, conditions for producing an optimal effect of the thin film transistor substrate according to an embodiment of the present invention will be described with respect to the gap between the at least one first protrusion 152*a* and the lengths in the first and second directions of the at least one first protrusion 152*a*.

As illustrated in the enlarged drawing indicated by arrows in FIG. 1A, the at least one first protrusion 152*a* can be provided as a plurality of first protrusions 152*a*. Accordingly, the plurality of first protrusions 152*a* may protrude in the first direction from one side of the body part 151.

The plurality of first protrusions 152*a* may have the same shape. Meanwhile, the plurality of first protrusions 152*a* may be provided as, for example, three first protrusions 152*a*. However, the number of the plurality of first protrusions 152*a* is not limited thereto.

According to an embodiment of the present disclosure, the distance d between the plurality of first protrusions 152*a* may be constant. Conductivity of the active layer 130 may be controlled by adjusting a distance d between the plurality of first protrusions 152*a*. For example, when the distance d between the plurality of first protrusions 152*a* is constant, the active layer 130 in which is conductive may have uniform characteristics. However, the distance d between the plurality of first protrusions 152*a* is not limited thereto, and the distance d between the plurality of first protrusions 152*a* may be formed differently.

The distance d between the plurality of first protrusions 152*a* may be 0.5 μm or more to 50 μm or less, and the distance d between the plurality of first protrusions 152*a* is preferably 2 μm or more and 20 μm or less.

When the distance d between the plurality of first protrusions 152*a* is 50 μm or more, the size of the first convex part 133*a* increases, and thus it is difficult to secure the threshold voltage Vth in a positive (+) direction, and when the distance d between the plurality of first protrusions 152*a* is 2 μm or less, the length of the channel part 131 may be excessively increased, and resistance may increase, thereby decreasing the amount of current flowing through the entire device.

Each of the plurality of first protrusions 152*a* protrudes in the first direction by a predetermined length l. As shown in FIG. 1A, the first protrusion 152*a* protrudes by a predetermined length l in a direction from one end, for example, a left end, of the body part 151 toward the source electrode 171.

According to an embodiment of the present disclosure, because each of the plurality of first protrusions 152*a* may protrude by the same length l, a plurality of first convex parts 133*a* provided in the first connection part 132*a* may have the same size. Meanwhile, the length l of each of the plurality of first protrusions 152*a* is not limited to the same length, and the length l of each of the plurality of first protrusions 152*a* may be formed to have different lengths.

The lengths l of the plurality of first protrusions 152*a* may be 0.5 μm or more and 5 μm or less. If the length l of the plurality of first protrusions 152*a* is less than 0.5 μm, a plurality of first convex parts 133*a* may not be obtained, and if the length l of the plurality of first protrusions 152*a* is more than 5 μm, the length of the channel part 131 may increase excessively. Meanwhile, the first protrusion 152*a* does not overlap the source electrode 171 because it does not extend to a region where the source electrode 171 is provided.

Each of the plurality of first protrusions 152*a* is formed to have a predetermined width w in the second direction. According to an embodiment of the present disclosure, each of the plurality of first protrusions 152*a* is formed to have the same width w. However, the present disclosure is not limited thereto, and the width w of each of the plurality of first protrusions 152*a* may be formed to have a different width.

The width w of the plurality of first protrusions 152*a* is preferably 0.5 μm or more and 20 μm or less. When the width w of the plurality of first protrusions 152*a* is less than 0.5 μm, the plurality of first convex parts 133*a* may not be obtained, and when the width w of the plurality of first protrusions 152*a* exceeds 20 μm, parasitic capacitance generated by the gate electrode 150 may increase.

Meanwhile, the distance d, the length l in the first direction, and the width w in the second direction between the plurality of first protrusions 152*a* are not limited to those described above, but may be variously optimized according to the knowledge of the art to adjust according to the characteristics of the device.

As illustrated in FIG. 1B, a partial region of the active layer 130 overlapping the body part 151 is conductive to form the first convex part 133*a*, in this case, the first concave part 131*a* is formed in the channel part 131 to correspond to the first convex part 133*a*. In addition, the second convex part 133*b* is formed in another part of the active layer 130 facing the first convex part 133*a*, and the second concave part 131*b* is formed in the channel part 131 to correspond to the second convex part 133*b*.

The first concave part 131*a* overlaps the left end of the body part 151, and the second concave part 131*b* overlaps the right end of the body part 151. In this case, because the plurality of first protrusions 152*a* are provided on the left side of the body part 151, a plurality of first concave parts 131*a* are formed in an area overlapping the left end of the body part 151. On the other hand, because the first protrusion 152*a* is not provided on the right side of the body part

151, one second concave part 131*b* is formed in a region overlapping the right end of the body part 151.

For example, if three first protrusions 152*a* are provided on one side of the body part 151, four first concave parts 131*a* may be provided on the left side of the channel part 131. Meanwhile, the number of the first protrusion 152*a* and the first concave part 131*a* is not limited thereto.

The first concave part 131*a* and the second concave part 131*b* may be provided in a rounded shape, and correspond to the first convex part 133*a* and the second convex part 133*b*, respectively.

The first connection part 132*a* may be formed at one side of the channel part 131 and may be electrically connected to the source electrode 171. In addition, the second connection part 132*b* may be formed on the other side of the channel part 131 and electrically connected to the drain electrode 172. Meanwhile, a method of connecting the first connection part 132*a* and the second connection part 132*b* to the source electrode 171 and the drain electrode 172 respectively is not limited thereto, and in some cases, the first connection part 132*a* may be electrically connected to the drain electrode 172, and in this case, the second connection part 132*b* may be electrically connected to the source electrode 171.

Because the thin film transistor according to FIG. 1B has the first protrusion 152*a* only on the left side of the body part 151 and does not have a separate protrusion on the right side of the body part 151, the first connection part 132*a* and the second connection part 132*b* are asymmetrically provided with respect to the channel part 131.

Meanwhile, according to an embodiment of the present disclosure, because the first protrusion 152*a* is provided on one side of the body part 151, the first convex part 133*a* may be formed of a plurality of first convex parts 133*a*. For example, as illustrated in FIG. 1B, if three first protrusions 152*a* are provided on one side of the body part 151, four first convex parts 133*a* may be provided on the left side of the channel part 131 overlapping the body part 151. However, the number of the first protrusion 152*a* and the first convex part 133*a* is not limited thereto.

The plurality of first convex parts 133*a* are formed as a part of the active layer 130, where the plurality of first protrusions 152*a* are not formed, becomes a conductor. Accordingly, the plurality of first convex parts 133*a* do not overlap the plurality of first protrusions 152*a* in the horizontal direction.

In addition, because the gap between the plurality of first protrusions 152*a* is formed equal, the gap between the plurality of first convex parts 133*a* may be formed equal. For example, a gap between the plurality of first convex parts 133*a* may be formed equal to the width w of the first protrusion 152*a* in the second direction.

The first convex part 133*a* and the second convex part 133*b* may be provided in a rounded shape, and correspond to the first concave part 131*a* and the second concave part 131*b*, respectively.

In this case, because the at least one first protrusion 152*a* is provided on one side of the body part 151 and a separate protrusion is not provided on the other side of the body part 151, the first convex part 133*a* and the second convex part 133*b* may be formed asymmetrically with respect to the channel part 131. The second connection part 132*b* may include one second convex part 133*b*, and the second convex part 133*b* may have a size relatively larger than that of the first convex part 133*a*.

Figure 2:
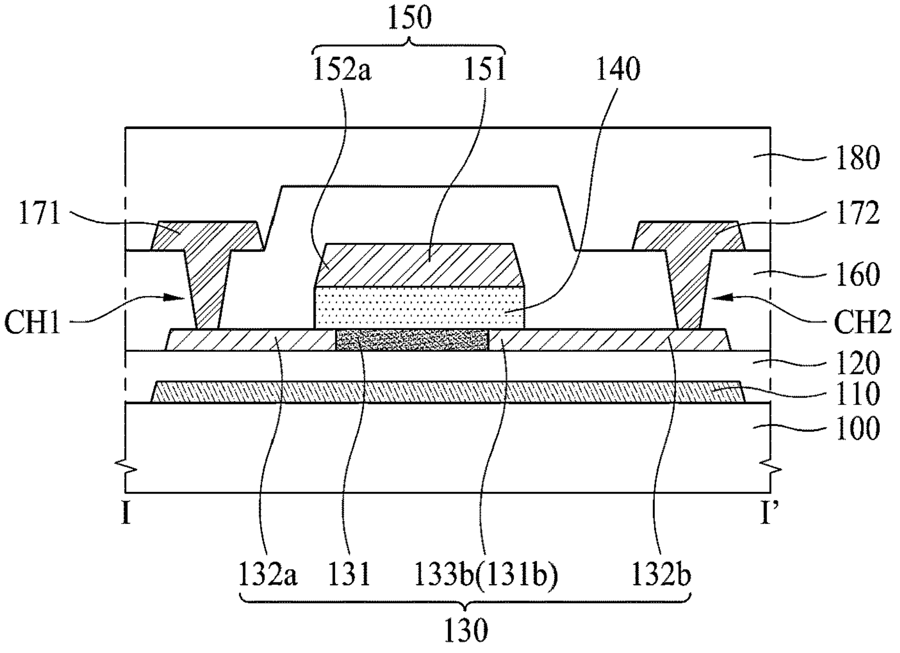
FIG. 2 is a cross-sectional view of a thin film transistor substrate according to an embodiment of the present disclosure, and is a cross-sectional view taken along line I-I' of FIG. 1B.

FIG. 2 is a cross-sectional view of a thin film transistor substrate according to an embodiment of the present disclosure, and FIG. 2 is a cross-sectional view taken along line I-I' of FIG. 1B. Here, FIG. 2 corresponds to a cross section of a region in which the protrusion 152*a* of the gate electrode 150 is formed.

As illustrated in FIG. 2, the thin film transistor substrate according to an embodiment of the present disclosure may include a substrate 100, a light blocking layer 110, a buffer layer 120, an active layer 130, a gate insulating layer 140, a gate electrode 150, an interlayer insulating layer 160, a source electrode 171, a drain electrode 172, and a planarization layer 180.

The substrate 100 may be made of glass or plastic. In particular, the substrate 100 may be made of transparent plastic having flexible properties, for example, polyimide. When polyimide is used as the substrate 100, considering that a high-temperature deposition process is performed on the substrate 100, a heat-resistant polyimide capable of enduring high temperatures may be used.

The light blocking layer 110 is formed on the substrate 100. Meanwhile, in some cases, the light blocking layer 110 may be omitted. As the light blocking layer 110 overlaps the channel part 131 of the active layer 130, the light blocking layer 110 may protect the channel part 131 of the active layer 130 by blocking light entering from the lower portion of the substrate 100.

The light blocking layer 110 may include at least one of an aluminum-based metal, such as aluminum Al or an aluminum Al alloy, a silver-based metal, such as silver Ag or silver Ag alloy, a copper-based metal, such as copper Cu or copper Cu alloy, a molybdenum-based metal, such as molybdenum Mo or molybdenum Mo alloy, chromium Cr, tantalum Ta, neodymium Nd, and titanium Ti.

The buffer layer 120 is formed on the light blocking layer 110. Because the buffer layer 120 is formed on a part of the substrate 100 and the light blocking layer 110, the substrate 100 and the buffer layer 120 may be formed to surround the light blocking layer 110. The buffer layer 120 may be formed of an inorganic insulating material such as silicon oxide, silicon nitride, or metal oxide, but is not limited thereto and may be formed of an organic insulating material. The buffer layer 120 may be formed of a single layer or a plurality of layers.

The active layer 130 is formed on the buffer layer 120. The active layer 130 includes the channel part 131, the first connection part 132*a* provided on one side of the channel part 131, and the second connection part 132*b* provided on the other side of the channel part 131. The channel part 131 overlaps the gate electrode 150, particularly, the body part 151.

The first connection part 132*a* is connected to one side of the channel part 131. A part of the first connection part 132*a* does not overlap the gate electrode 150, and the other part of the first connection part 132*a* overlaps the gate electrode 150, for example, the first protrusion 152*a*. The first connection part 132*a* does not penetrate to a lower portion of the body part 151 of the gate electrode 150. Accordingly, in the region where the protrusion 152*a* of the gate electrode 150 is formed, the first convex part 133*a* according to FIG. 1B is not formed in the first connection part 132*a*.

As described above, because the first convex part 133*a* is not formed in the first connection part 132*a* overlapping the first protrusion 152*a*, the length of the channel part 131 may be relatively increased. Accordingly, it is possible to control that the threshold voltage Vth of the thin film transistor of the present disclosure is shifted in a negative (−) direction.

The second connection part 132*b* is connected to the other side of the channel part 131. A part of the second connection part 132*b* does not overlap the gate electrode 150, and the other part of the second connection part 132*b* overlaps the gate electrode 150, in particular, the body part 151. The second connection part 132*a* may penetrate into a lower part of the body part 151 and, thus, may include the second convex part 133*b*. Furthermore, the second concave part 131*b* may be formed on the other side of the channel part 131 in response to the second convex part 133*b*, for example, at a part adjacent to the second connection part 132*b*.

The active layer 130 forms a channel by applying a constant voltage to the gate electrode 150 and provides a space in which the charge carrier moves through the channel. Accordingly, as the charge carrier moves through the channel formed in the active layer 130, a current flows through the thin film transistor according to an embodiment of the present disclosure. The active layer 130 overlaps the gate electrode 150 and applies a voltage higher than the threshold voltage Vth to the gate electrode 150, so that the charge carrier may move through the active layer 130.

The active layer 130 may include a semiconductor material, for example, an oxide semiconductor material. The oxide semiconductor material is, for example, an IZO (InZnO)-based oxide semiconductor material, an IGO (InGaO)-based oxide semiconductor material, an ITO (InSnO)-based oxide semiconductor material, an IGZO (InGaZnO)-based oxide semiconductor material, an IGZTO (InGaZnSnO)-based oxide semiconductor material, a GZTO (GaZnSnO)-based oxide semiconductor material, a GZO (GaZnO)-based semiconductor material, an IZTO (InZnSnO)-based oxide semiconductor material and an FIZO (FeInZnO)-based oxide semiconductor material.

The gate insulating layer 140 may be formed on the active layer 130. As shown in FIG. 2, the thin film transistor substrate in accordance with an embodiment of present disclosure may be provided in a structure in which the gate insulating layer 140 is etched. Etched structure refers to a structure formed by patterning a part of the gate insulating layer 140 provided on the substrate 100 using the gate electrode 150 as a mask, leaving only the remaining part of the gate insulating layer 140 corresponding to the gate electrode 150.

The gate insulating layer 140 may include a silicon nitride layer SiNx or a silicon oxide layer SiOx, but is not limited thereto. The gate insulating layer 140 may have a single layer structure or a multilayer structure.

Plasma may be used when patterning the gate insulating layer 140, and the first connection part 132*a* and the second connection part 132*b* may be formed by irradiating the exposed region of the active layer 130. However, the present disclosure is not limited thereto, and the first connection part 132*a* and the second connection part 132*b* may be formed by performing a separate ion doping process after the patterning process of the gate insulating layer 140.

The gate electrode 150 may be formed on the gate insulating layer 140. The gate electrode 150 may include at least one of an aluminum-based metal such as aluminum Al or aluminum Al alloy, a silver-based metal such as silver Ag or silver Ag alloy, a copper-based metal such as copper Cu or copper Cu alloy, a molybdenum-based metal such as molybdenum Mo or molybdenum Mo alloy, chromium Cr, tantalum Ta, neodymium Nd, and titanium Ti. The gate electrode 150 may have a multilayer structure including at least two conductor layers having different physical properties.

The gate electrode 150 is formed on the active layer 130 and overlaps the active layer 130. The gate electrode 150 includes the body part 151 and the first protrusion 152*a*. The first protrusion 152*a* is provided on one side, for example, on the left side of the body part 151. Meanwhile, because there is no separate protrusion on the other side of the body part 151 for example, on the right side, the gate electrode 150 is formed asymmetrically with respect to the body part 151.

Meanwhile, because the first protrusion 152*a* may be provided only on one side of the body part 151, the first connection part 132*a* and the second connection part 132*b* of the active layer 130 may be formed asymmetrically with respect to the channel part 131.

The gate electrode 150 protects the channel part 131 in a process of conducting the active layer 130. For example, the body part 151 may protect the channel part 131.

The first protrusion 152*a* also protects a portion of the active layer 130. Meanwhile, the first protrusion 152*a* overlaps the first connection part 132*a* provided in the active layer 130.

The interlayer insulating layer 160 is provided on the gate electrode 150. For example, the interlayer insulating layer 160 may be provided on a portion of the buffer layer 120, a portion of the active layer 130, a portion of the gate insulating layer 140, and the gate electrode 150.

The interlayer insulating layer 160 insulates the gate electrode 150 from the source electrode 171, and further insulates the gate electrode 150 from the drain electrode 172. The interlayer insulating layer 160 may include a single layer or a plurality of layers including an inorganic insulating material and/or an organic insulating material.

The interlayer insulating layer 160 is provided with a first contact hole CH1 and a second contact hole CH2. Accordingly, the first connection part 132*a* of the active layer 130 may be exposed by the first contact hole CH1, and the second connection part 132*b* of the active layer 130 may be exposed by the second contact hole CH2.

The source electrode 171 and the drain electrode 172 may be formed on the interlayer insulating layer 160. The source electrode 171 is electrically connected to one side of the active layer 130, for example, the first connection part 132*a*, and the drain electrode 172 is electrically connected to the other side of the active layer 130, for example, the second connection part 132*b*.

For example, the source electrode 171 may be connected to the first connection part 132*a* through a first contact hole CH1 provided in the interlayer insulating layer 160, and the drain electrode 172 may be connected to the second connection part 132*b* through a second contact hole CH2 provided in the interlayer insulating layer 160.

The planarization layer 180 is provided on the interlayer insulating layer 160, the source electrode 171, and the drain electrode 172. Meanwhile, although not shown in the planarization layer 180, a third contact hole CH3 may be provided. This will be described with reference to FIG. 12.

Figure 3:
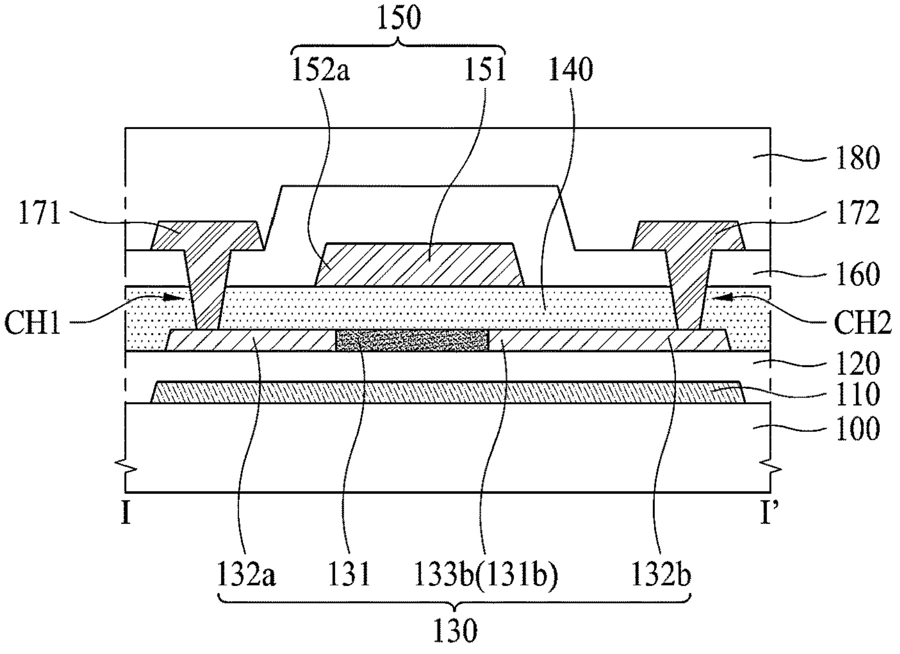
FIG. 3 is a cross-sectional view of a thin film transistor substrate according to another embodiment of the present disclosure.

FIG. 3 is a cross-sectional view of a thin film transistor substrate according to another embodiment of the present disclosure. The description of FIG. 3 is similar to the thin film transistor substrate according to FIG. 2, except that the gate insulating layer 140 is formed in an etchless structure, and thus different configurations will be mainly described below.

The gate insulating layer 140 is formed on the active layer 130. For example, as the gate insulating layer 140 may be formed on a portion of the buffer layer 120 and the active layer 130, the active layer may be formed to be surrounded by the buffer layer 120 and the gate insulating layer 140.

Meanwhile, as shown in FIG. 3, the gate insulating layer 140 may have an etchless structure. The etchless structure refers to a structure in which the gate insulating layer 140 formed on the substrate 100 is provided throughout the substrate 100 using the gate insulating layer 140 without any particular patterning.

Because the gate insulating layer 140 is formed in an etchless structure, the first contact hole CH1 and the second contact hole CH2 are provided in the gate insulating layer 140, furthermore, the source electrode 171 is connected to an one side of the active layer 130, for example, the first connection part 132*a* via the gate insulating layer 140 and the interlayer insulating layer 160 and the drain electrode 172 is connected to the other side of the active layer 130, for example, the second connection part 132*b* via the gate insulating layer 140 and the interlayer insulating layer 160. In the etchless structure, a first connection part 132*a* and a second connection part 132*b* of the active layer 130 may be formed by performing a separate ion doping process.

Figure 4:
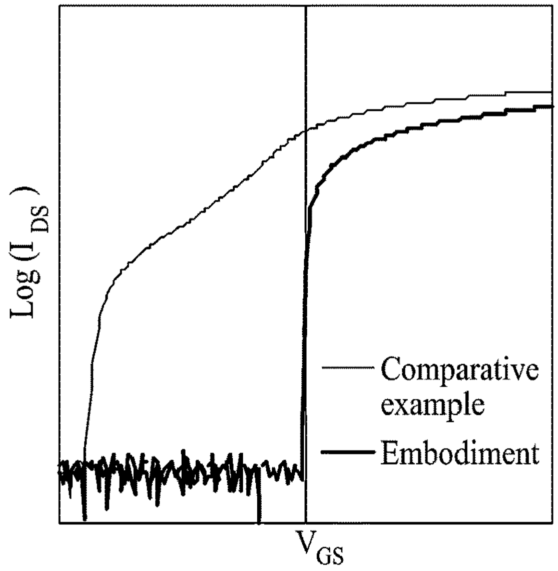
FIG. 4 is a Vgs-Ids graph showing how Vth changes compared to a conventional thin film transistor when a thin film transistor according to an embodiment of the present disclosure is used.

FIG. 4 is a Vgs-Ids graph of a thin film transistor substrate according to an embodiment of the present disclosure.

The Vgs-Ids graph of FIG. 4 illustrates a transfer curve in accordance with the embodiment and a transfer curve in accordance with the comparative example, respectively. In this case, in the thin film transistor according to an embodiment of the present disclosure, the first protrusion 152*a* is provided on one side of the body part 151. On the other hand, the thin film transistor according to the comparative example does not have a separate protrusion on the gate electrode 150.

In the case of the transfer curve of the comparative example, a threshold voltage Vth is formed on the left side compared to the transfer curve of the embodiment, and the transfer curve of the embodiment has a threshold voltage Vth of positive (+) compared to the transfer curve of the comparative example.

In the case of the thin film transistor substrate according to the embodiment with the first protrusion 152*a*, the threshold voltage Vth may be shifted in a positive (+) direction compared to the thin film transistor substrate according to the comparative example without the first protrusion 152*a*. The length of the channel part 131 may be adjusted by the first protrusion 152*a*, and as a result, the length of the channel part 131 is adjusted to shift the threshold voltage Vth of the thin film transistor substrate of the present disclosure in a positive (+) direction.

Figure 5A:
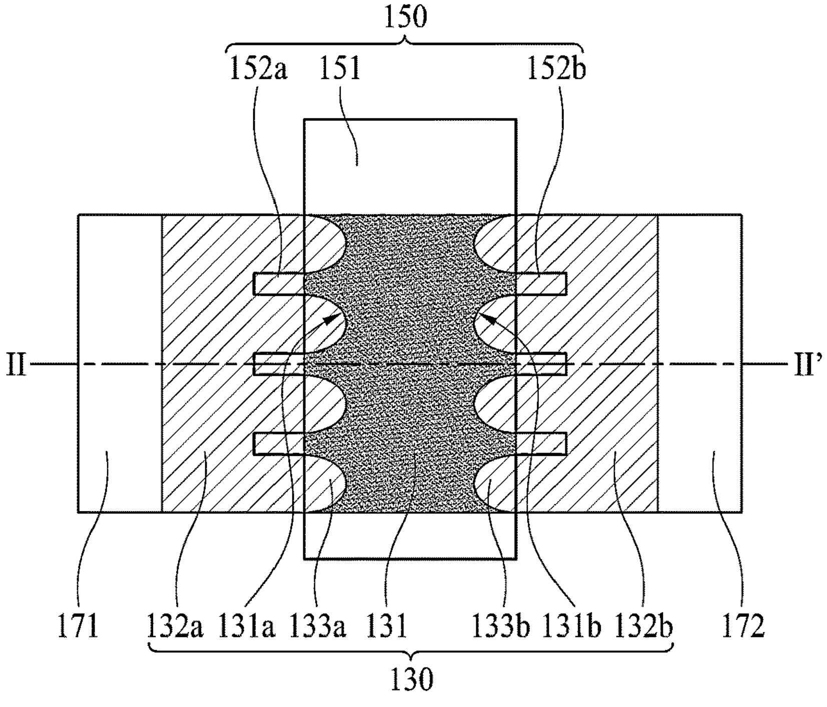
FIG. 5A is a plan view of a thin film transistor substrate according to another embodiment of the present disclosure.

FIG. 5A is a plan view of a thin film transistor substrate according to another embodiment of the present disclosure.

Unlike FIG. 1B, the thin film transistor substrate according to FIG. 5A has the second protrusion 152*b* on the other side of the body part 151 of the gate electrode 150 and thus the second convex part 133*b* is formed in the second connection part 132*b* of the active layer 130. Except for this point, because it is similar to FIG. 1B, only a configuration different from FIG. 1B will be described below.

The gate electrode 150 includes a body part 151, at least one first protrusion 152*a*, and at least one second protrusion 152*b*, as illustrated in FIG. 5A.

At least one first protrusion 152*a* is provided on one side, for example, on the left side of the body part 151, and at least on second protrusion 152*b* is provided on the other side, for example, on the right side of the body part. Accordingly, one side and the other side of the gate electrode 150 may be formed symmetrically with respect to the body part 151.

In this case, because the at least one first protrusion 152*a* and the at least one second protrusion 152*b* are symmetrically formed around the body part 151, the first connection part 132*a* and the second connection part 132*b* provided while the active layer 130 becomes conductive may be symmetrically formed with respect to the channel part 131.

The description of the at least one first protrusion 152*a* is similar to that described in FIG. 1A, and thus will be omitted.

The at least one second protrusion 152*b* may be provided on the other side of the body part 151, for example, on the right side, and may extend from the body part 151 in the first direction. As shown in FIG. 5A, the at least one second protrusion 152*b* extends from the body part 151 toward the drain electrode 172. In addition, the at least one second protrusion 152*b* may be provided to face the at least one first protrusion 152*a*.

As described above, when the gate electrode 150 includes a plurality of first protrusions 152*a* and second protrusions 152*b*, the active layer 130 includes multiple first convex parts 133*a* and second convex parts 133*b*, so that the horizontal length of the channel part 131 are relatively increased than the thin film transistor substrate shown in FIG. 1B.

In addition, because the first protrusion 152*a* and the second protrusion 152*b* are provided, the active layer 130 is not conductive in the region between the plurality of first convex parts 133*a* and the region between the plurality of second convex parts 133*b*. Accordingly, in the region between the plurality of first convex parts 133*a* and the region between the plurality of second convex parts 133*b*, the horizontal length of the channel part 131 are relatively increased than the thin film transistor substrate according to FIG. 1B.

As a result, by the plurality of first protrusions 152*a* provided on one side of the body part 151 and the plurality of second protrusions 152*b* provided on the other side of the body part 151, the plurality of first convex parts 133*a* may be formed in the first connection part 132*a*, and the plurality of second convex parts 133*b* may be formed in the second connection part 132*b*, and as a result, the horizontal length of the channel part 131 may be relatively increased as compared with the thin film transistor substrate according to FIG. 1B.

Meanwhile, because the second protrusion 152*b* is provided symmetrically with the first protrusion 152*a* around the body part 151, the number of the first protrusion 152*a*, the distance d between the plurality of first protrusions 152*a*, and the length l in the first direction and the width w of the at least one first protrusion 152*a* may also be applied under the same or similar conditions.

The channel part 131 may have a first concave part 131*a* on one side, for example, a left side, and a second concave part 131*b* on the other side, for example, a right side. Because the thin film transistor according to FIG. 5A has protrusions 152*a* and 152*b* on one side and the other side of the body part 151, the first concave part 131*a* and the second concave part 131*b* are symmetrically provided with respect to the channel part 131. Accordingly, similar description of the first concave part 131*a* and the second concave part 131*b* will be omitted.

In the thin film transistor according to FIG. 5A, because the first concave part 131*a* and the second concave part 131*b* are symmetrically provided in the channel part 131, the horizontal length of the channel part 131 may be relatively longer.

The first connection part 132*a* and the second connection part 132*b* may be formed symmetrically with respect to the channel part 131. Here, the first convex part 133*a* is provided at one side of the first connection part 132*a*, and the other side of the first connection part 132*a* is electrically connected to the source electrode 171. In addition, the second convex part 133*b* is provided on one side of the second connection part 132*b*, and the other side of the second connection part 132*b* is electrically connected to the drain electrode 172.

The second connection part 132*b* may include the at least one second convex part 133*b*. The at least one second convex part 133*b* can be formed symmetrically with the at least one first convex part 133*a* around the channel part 131.

The thin film transistor according to FIG. 5A has a first convex part 133*a* in the first connection part 132*a* and a second convex part 133*b* in the second connection part 132*b* symmetrically with the first convex part 133*a*, so that the length of the channel part 131 is relatively longer. Accordingly, the threshold voltage Vth of the thin film transistor substrate according to the embodiment of FIG. 5A may be controlled not to be shifted in a negative (−) direction.

Figure 5B:
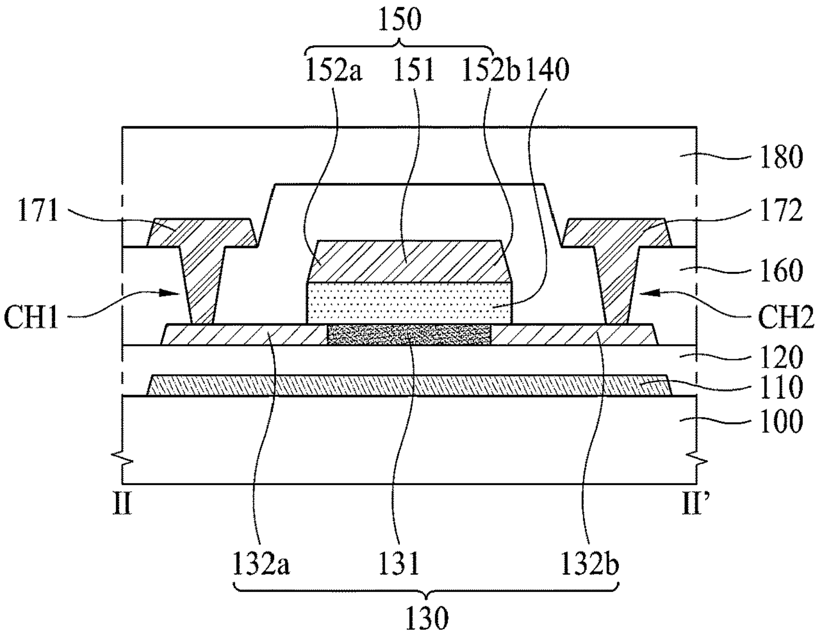
FIG. 5B is a cross-sectional view of a thin film transistor substrate according to another embodiment of the present disclosure.

FIG. 5B is a cross-sectional view of a thin film transistor substrate according to another embodiment of the present disclosure, and FIG. 5B is a cross-sectional view taken along line II-II' of FIG. 5A.

The embodiment according to FIG. 5B is similar except for the configuration of the gate electrode 150 and the configuration of the second convex part 133*b* provided in the active layer 130, and thus only different configurations will be described below.

As shown in FIG. 5B, the active layer 130 includes the channel part 131, the first connection part 132*a*, and the second connection part 132*b*. The second connection part 132*b* is connected to the other side of the channel part 131, for example, the right side of the channel part 131 in the figure.

A portion of the second connection part 132*b* does not overlap the gate electrode 150, and the remaining portion of the second connection part 132*b* overlaps the gate electrode 150, in particular, the second protrusion 152*b*. The second connection part 132*b* does not penetrate to a lower portion of the body part 151 of the gate electrode 150. Accordingly, in a region where the second protrusion 152*b* of the gate electrode 150 is formed, the second convex part 133*b* according to FIG. 5A is not formed in the second connection part 132*b*.

As described above, because the second convex part 133*b* is not formed in the second connection part 132*b* overlapping the second protrusion 152*b*, the length of the channel part 131 may be relatively increased. Accordingly, it is possible to control that the threshold voltage Vth of the thin film transistor of the present disclosure is shifted in a negative (−) direction.

According to an embodiment of the present disclosure, the gate electrode 150 includes the body part 151, the first protrusion 152*a*, and the second protrusion 152*b*. In this case, the first protrusion 152*a* and the second protrusion 152*b* may be formed symmetrically with respect to the body 151. The second protrusion 152*b* also protects a portion of the active layer 130 like the body part 151 and the first protrusion 152*a*. Meanwhile, the second protrusion 152*b* overlaps the second connection part 132*b* provided in the active layer 130.

Figure 6:
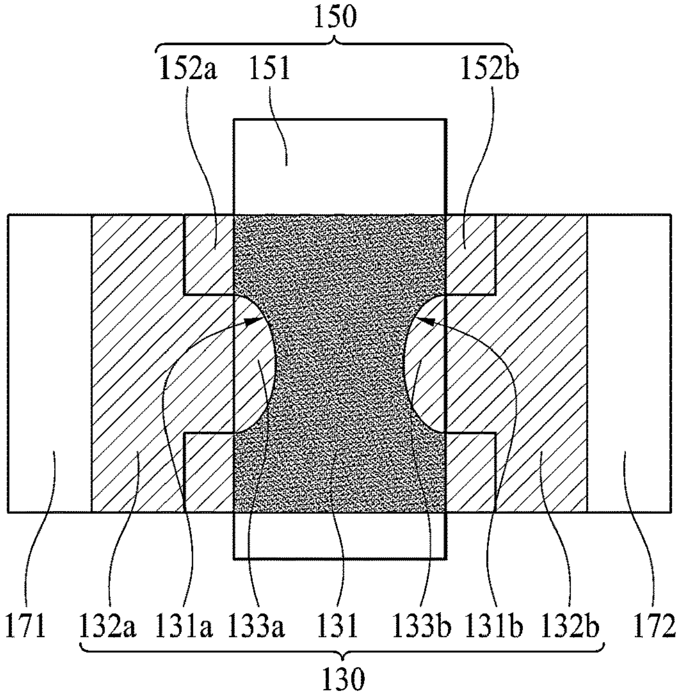
FIG. 6 is a plan view of a thin film transistor substrate according to another embodiment of the present disclosure.

FIG. 6 is a plan view of a thin film transistor substrate according to another embodiment of the present disclosure.

The thin film transistor substrate according to FIG. 6 is similar to FIG. 5A except that the first protrusion 152*a* and the second protrusion 152*b* overlap one end or the other end of the active layer 130 in the thin film transistor substrate according to FIG. 5A, and thus only a configuration different from FIG. 5A will be described below.

In the thin film transistor substrate according to another embodiment of the present disclosure, as shown in FIG. 6, any one of the plurality of first protrusions 152*a* overlaps one end of the active layer 130. In this case, the one end of the active layer 130 may overlap the gate electrode 150.

In addition, the any one of the plurality of first protrusions 152*a* overlaps the other end of the active layer 130. In this case, the other end of the active layer 130 may overlap the gate electrode 150 and may be positioned in a direction facing the one end of the active layer 130.

For example, the any one of the plurality of the first protrusions 152*a* may coincide with the one end of the active layer 130, and the any other of the plurality of the first protrusion 152*a* may coincide with the other end of the active layer 130.

Because the first protrusion 152*a* and the second protrusion 152*b* are symmetrically formed with respect to the body part 151, the above-described description may also be applied to the second protrusion 152*b*. Accordingly, a description of the second protrusion 152*b* will be omitted.

Figure 7:
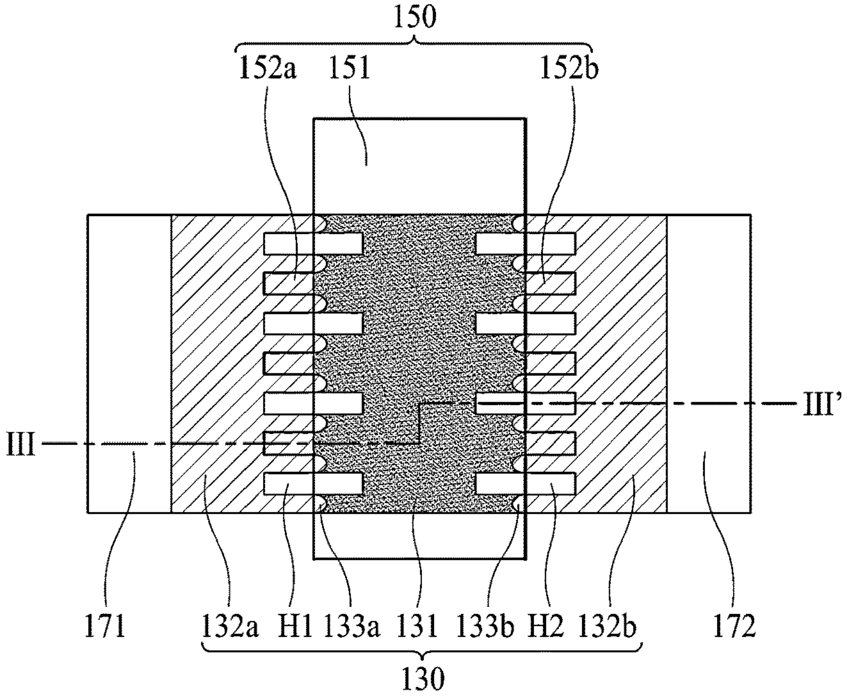
FIG. 7 is a plan view of a thin film transistor substrate according to another embodiment of the present disclosure.

FIG. 7 is a plan view of a thin film transistor substrate according to another embodiment of the present disclosure.

The thin film transistor substrate according to FIG. 7 is similar to FIG. 5A except that the active layer 130 includes a first active hole H1 and a second active hole H2, and thus only a configuration different from FIG. 5A will be described below.

According to another embodiment of the present disclosure, as illustrated in FIG. 7, the active layer 130 may include a channel part 131, a first connection part 132*a* including at least one first convex part 133*a*, a second connection part 132*b* including at least one second convex part 133*b*, at least one first active hole H1 and at least one second active hole H2. The at least one first active hole H1 is provided on one side of the active layer 130, and the at least one second active hole H2 is provided on the other side of the active layer 130.

In accordance with an embodiment of this disclosure, the at least one first active hole H1 and the second active hole H2 can be formed by patterning a part of the active layer 130. The active layer 130 may not be provided at positions where the first active hole H1 and the second active hole H2 are formed. Meanwhile, the first active hole H1 and the second active hole H2 are not limited thereto, and the active layer 130 may partially exist at a position where the first active hole H1 and the second active hole H2 are formed. Therefore, a thickness of a part of the active layer 130 provided in the first active hole H1 and the second active hole H2 may be thinner than a thickness of the remaining part of the active layer 130 not provided with the first active hole H1 and the second active hole H2.

The at least one first active hole H1 may be provided between the channel part 131 and the first connection part 132*a*. In addition, a portion of the at least one first active hole H1 may not overlap the entire gate electrode 150, and the remaining portion of the at least one first active hole H1 may overlap the body part 151 of the gate electrode 150. However, the at least one first active hole H1 may not overlap the first protrusion 152*a* of the gate electrode 150.

Accordingly, the at least one first active hole H1 is formed in a region between a plurality of first protrusions 152*a*. In addition, the at least one first active hole H1 may be formed in a region between a plurality of first convex parts 133*a*.

The at least one first active hole H1 may be provided as a plurality of first active holes H1, and the plurality of first active holes H1 may be arranged in a line in the same shape. In addition, a gap between the plurality of first active holes H1 may be formed to be the same. Because the first active holes H1 are formed to have the same gap, the entire first connection part 132*a* may be uniformly formed.

As the first active hole H1 is formed in this way, the degree of conductivity of the active layer 130 is reduced during the conducting process, and thus the size of the first convex part 133*a* is reduced, and thus the length of the channel part 131 is lengthened.

Similarly, the at least one second active hole H2 may be provided between the channel part 131 and the second connection part 132*b*. In addition, a portion of the at least one second active hole H2 may not overlap the entire gate electrode 150, and the remaining portion of the at least one second active hole H2 may overlap the body part 151 of the gate electrode 150. However, the at least one second active hole H2 may not overlap the second protrusion 152*b* of the gate electrode 150.

Accordingly, the at least one second active hole H2 is formed in a region between a plurality of second protrusions 152*b*. In addition, the at least one second active hole H2 may be formed in a region between a plurality of second convex parts 133*b*.

The at least one second active hole H2 may be provided as a plurality of second active holes H2, and the plurality of second active holes H2 may be arranged in a line in the same shape. In addition, a gap between the plurality of second active holes H2 may be formed to be the same. Because the second active holes H2 are formed to have the same gap, the entire second connection part 132*b* may be uniformly formed.

As the second active hole H2 is formed in this way, the degree of conductivity of the active layer 130 is reduced during the conducting process, thereby reducing the size of the second convex part 133*b*, and thus the length of the channel part 131 is increased. As a result, because the horizontal length of the channel part 131 become relatively long, the threshold voltage Vth of the thin film transistor substrate according to FIG. 7 may not be shifted in a negative (−) direction.

Figure 8:
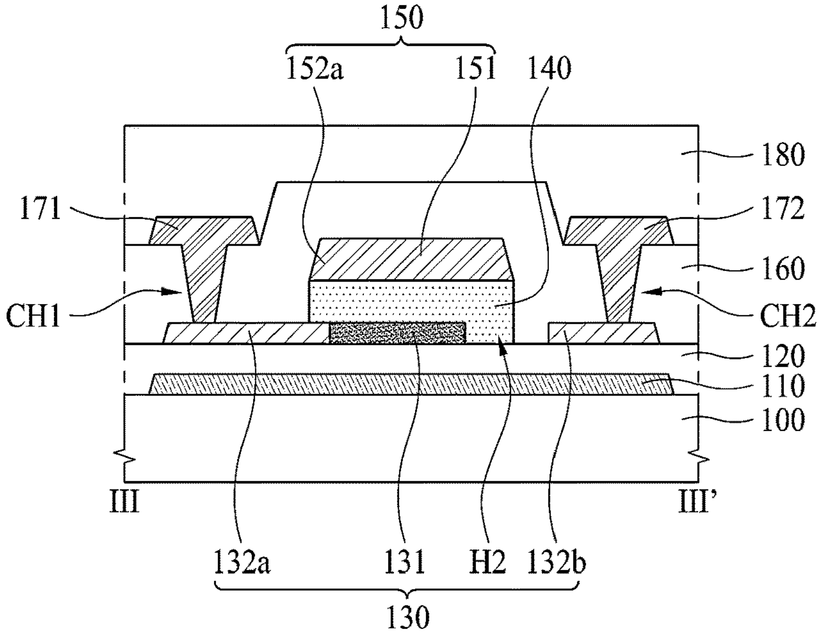
FIG. 8 is a cross-sectional view of a thin film transistor substrate according to another embodiment of the present disclosure, and is a cross-sectional view taken along line III-III' of FIG. 7.

FIG. 8 is a cross-sectional view of a thin film transistor substrate according to another embodiment of the present disclosure, and FIG. 8 is a cross-sectional view taken along line III-III' of FIG. 7. FIG. 8 is a cross-sectional view including the first protrusion 152*a* and the second active hole H2 in a plan view of the thin film transistor substrate of FIG. 7. The thin film transistor substrate according to FIG. 8 is similar to the thin film transistor substrate according to FIG. 2, except that the second active hole H2 is provided in the active layer 130 and thus a configuration different from FIG. 2 will be described below.

As shown in FIG. 8, the active layer 130 may include a channel part 131, a first connection part 132*a*, a second connection part 132*b*, and a second active hole H2. In this case, the second active hole H2 may be formed between the channel part 131 and the second connection part 132*b*.

Meanwhile, although not shown, the active layer 130 may be formed in a multilayer structure. For example, the active layer 130 may be formed in a double-layer structure. In this case, the active layer 130 may include a first active layer and a second active layer provided on the first active layer. The second active hole H2 may be formed in the first active layer 130, and the second active hole H2 may not be formed in the second active layer. In this case, a portion of the second active layer may contact the buffer layer 120 through the second active hole H2 formed only in the first active layer. However, the active layer 130 is not limited to the double layer structure, and may be formed in a three-layer structure or a four-layer structure.

A portion of the gate insulating layer 140 formed on the active layer 130 and a portion of the interlayer insulating layer 160 formed on the gate insulating layer 140 may be provided inside the second active hole H2. In the etch structure of the gate insulating layer 140, because the gate insulating layer 140 is patterned using the gate electrode 150 as a mask, only the gate insulating layer 140 that overlaps the gate electrode 150 remains, and the gate insulating layer 140 that does not overlap the gate electrode 150 is removed.

Furthermore, because the interlayer insulating layer 160 is formed after patterning the gate insulating layer 140, a portion of the interlayer insulating layer 160 may be formed in the second active hole H2. Therefore, the gate insulating layer 140 may be provided in a part where the second active hole H2 and the gate electrode 150 overlap, but the gate insulating layer 140 is not provided in a part where the second active hole H2 and the gate electrode 150 do not overlap, and a portion of the interlayer insulating layer 160 is provided.

Figure 9:
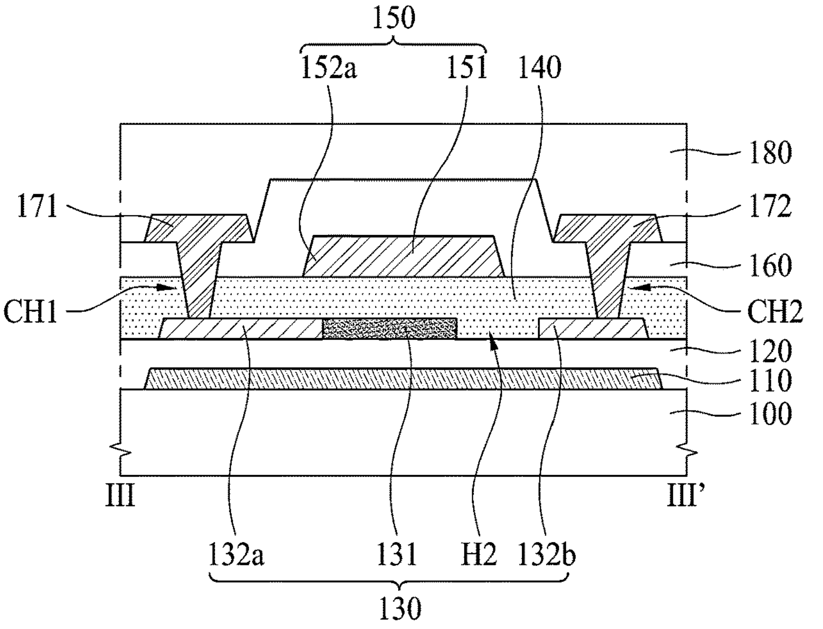
FIG. 9 is a cross-sectional view of a thin film transistor substrate according to another embodiment of the present disclosure, and is a cross-sectional view taken along line III-III' of FIG. 7.

FIG. 9 is a cross-sectional view of a thin film transistor substrate according to another embodiment of the present disclosure. FIG. 9 is a cross-sectional view taken along line III-III' of FIG. 7. The description of FIG. 9 is similar to the thin film transistor substrate according to FIG. 8, except that the gate insulating layer 140 is formed in an etchless structure, and thus different configurations will be mainly described below.

The gate insulating layer 140 is formed on the active layer 130. For example, the gate insulating layer 140 may be provided on a portion of the buffer layer 120, the channel part 131, the first connection part 132*a*, and the second connection part 132*b*, and the gate insulating layer 140 may also be provided in the second active hole H2 provided between the channel part 131 and the second connection part 132*b*.

The gate insulating layer 140 may be formed in an etchless structure as described in FIG. 3, and the etchless structure is similar to that described in FIG. 3, so it will be omitted. Because the gate insulating layer 140 may be formed in an etchless structure, the second active hole H2 may be provided with the gate insulating layer 140 as shown in FIG. 8.

Figure 10:
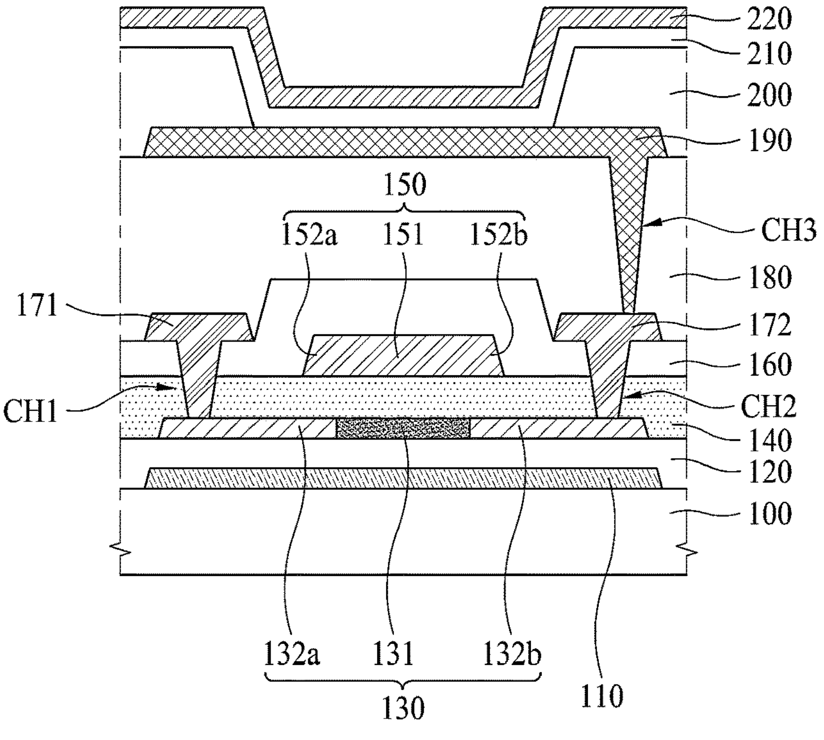
FIG. 10 is a cross-sectional view of a display apparatus including a thin film transistor substrate according to an embodiment of the present disclosure.

FIG. 10 is a cross-sectional view of a display apparatus including a thin film transistor substrate according to an embodiment of the present disclosure.

As shown in FIG. 10, the display apparatus according to an embodiment of the present disclosure includes a substrate 100, a light blocking layer 110, a buffer layer 120, an active layer 130, a gate insulating layer 140, a gate electrode 150, an interlayer insulating layer 160, a source electrode 171, a drain electrode 172, a planarization layer 180, a first electrode 190, a bank layer 200, a light emitting layer 210, and a second electrode 220. The substrate 100, the light blocking layer 110, the buffer layer 120, the active layer 130, the gate insulating layer 140, the gate electrode 150, the interlayer insulating layer 160, the source electrode 171, the drain electrode 172, and the planarization layer 180 are similar to those described above, repeated descriptions thereof will be omitted.

A third contact hole CH3 is provided on the planarization layer 180 so that the drain electrode 172 is exposed by the third contact hole CH3. However, in some cases, the source electrode 171 may be exposed by the third contact hole CH3.

The first electrode 190 is formed on the planarization layer 180 and is connected to the source electrode 171 or the drain electrode 172 through the third contact hole CH3. The first electrode 190 may function as an anode.

The bank layer 200 is provided to cover an edge of the first electrode 190 to define a light emitting area. Accordingly, an upper surface area of the first electrode 190 exposed without being covered by the bank layer 200 becomes a light emitting area.

The light emitting layer 210 is provided on the first electrode 190. The light emitting layer 210 may include red, green, and blue light emitting layers patterned for each pixel, or may be formed of a white light emitting layer connected from all pixels. When the light emitting layer 210 is formed of a white emission layer, the light emitting layer 210 may include, for example, a first stack including a blue emission layer, a second stack including a yellow green emission layer, and a charge generation layer provided between the first stack and the second stack, but is not limited thereto.

The second electrode 220 is provided on the light emitting layer 210. The second electrode 220 may function as a cathode. Although not shown, an encapsulation layer for preventing moisture or oxygen from penetrating may be additionally formed on the second electrode 220.

Figure 11:
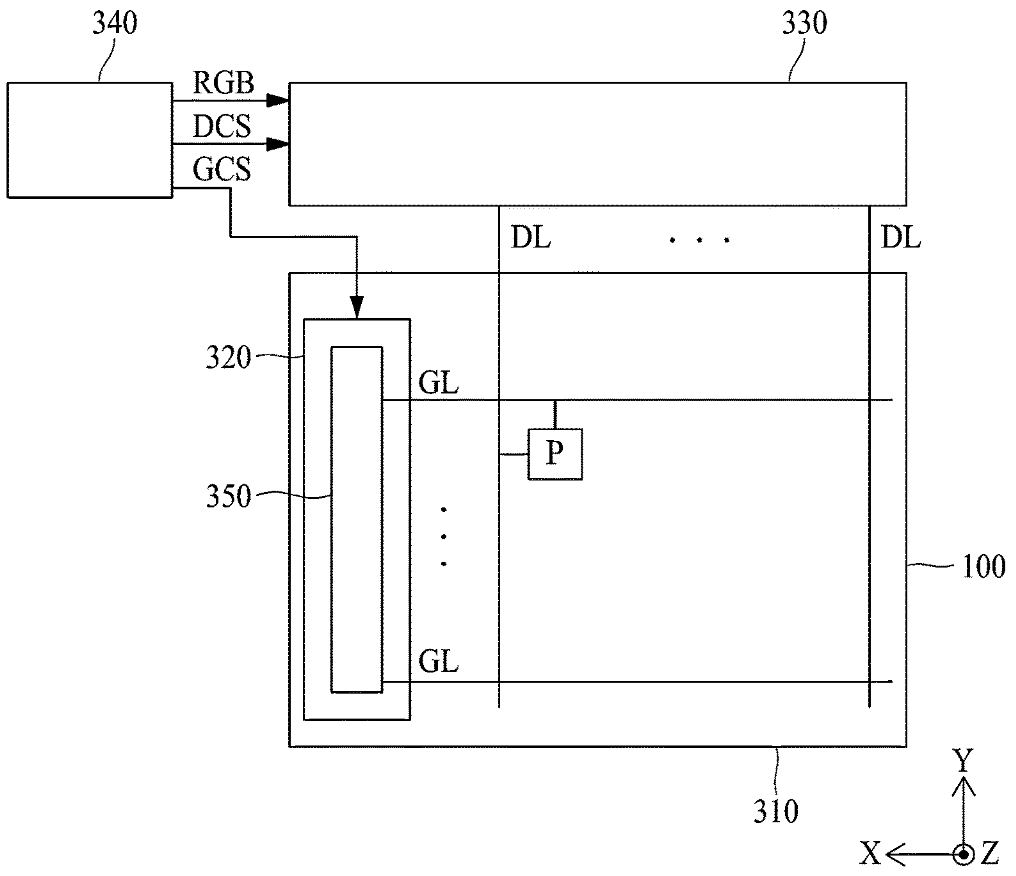
FIG. 11 is a schematic diagram of a display apparatus according to an embodiment of the present disclosure.

FIG. 11 is a schematic diagram of a display apparatus according to an embodiment of the present disclosure.

As shown in FIG. 11, the display apparatus according to an embodiment of the present disclosure may include a display panel 310, a gate driver 320, a data driver 330, and a controller 340. The display panel 310 includes gate lines GLs and data lines DLs, and pixels P are disposed in respective crossing areas of the gate lines GLs and data lines DLs. An image is displayed by driving the pixel P. The gate lines GLs, the data lines DLs, and the pixels P may be disposed on the substrate 100.

The controller 340 controls the gate driver 320 and the data driver 330. The controller 340 outputs a gate control signal GCS for controlling the gate driver 320 and a data control signal DCS for controlling the data driver 330 using a signal supplied from an external system (not shown). Also, the controller 340 samples input video data input from the external system and rearranges the sampled input video data, and supplies the rearranged digital video data RGB to the data driver 330.

The gate control signal GCS includes a gate start pulse GSP, a gate shift clock GSC, a gate output enable signal GOE, a start signal Vst, and a gate clock GCLK. Further, control signals for controlling a shift register may be included in the gate control signal GCS. The data control signal DCS includes a source start pulse SSP, a source shift clock signal SSC, a source output enable signal SOE, and a polarity control signal POL.

The data driver 330 supplies a data voltage to the data lines DL of the display panel 310. The data driver 330 converts the video data RGB inputted from the controller 340 into an analog data voltage and supplies the data voltage to the data lines DL.

The gate driver 320 may be mounted on the display panel 310. As described above, a structure in which the gate driver 320 is directly mounted on the display panel 310 is referred to as a gate in panel (GIP) structure. In the gate-in-panel (GIP) structure, the gate driver 320 may be disposed on the substrate 100.

The gate driver 320 may include a shift register 350. The shift register 350 sequentially supplies gate pulses to the gate lines GL during one frame by the use of start signal and gate clock transmitted from the controller 340. Herein, the one frame refers to a period in which one image is outputted through the display panel 310. The gate pulse has a turn-on voltage capable of turning on a switching device (thin film transistor) disposed in the pixel P.

Also, during the remaining period of one frame, in which the gate pulse is not supplied, the shift register 350 supplies a gate-off signal capable of turning off the switching device to the gate line GL. Hereinafter, the gate pulse and the gate-off signal are totally referred to as a scan signal GS.

Figure 12:
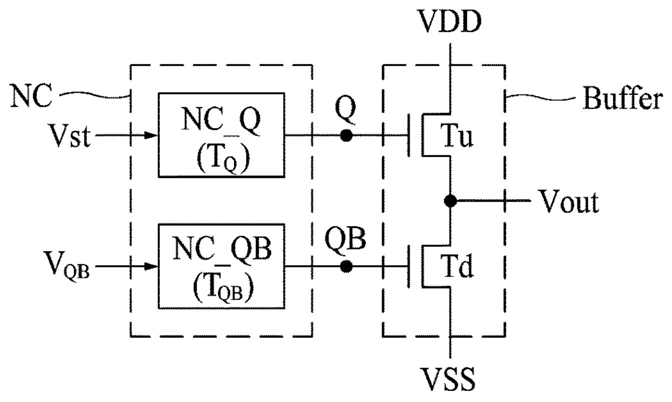
FIG. 12 is a circuit diagram of a shift register according to an embodiment of the present disclosure.

FIG. 12 is a circuit diagram of a shift register according to an embodiment of the present disclosure.

As shown in FIG. 12, the GIP circuit includes a full-up node Q, a full-down node QB, a node controller NC, and a buffer unit Buffer. The buffer unit Buffer is connected to an output terminal and includes a full-up transistor Tu, a full-down transistor Td, and a capacitor C.

The full-up transistor Tu is turned on to output the gate-on signal when the full-up node Q is charged with a gate high voltage. The full-down transistor Td is turned on to output the gate-off signal when the full-down node QB is charged with a gate low voltage.

The capacitor C serves to maintain the gate high voltage supplied to the full-up transistor Tu for one frame, and is provided between the gate terminal and the source terminal of the full-up transistor Tu.

The node controller NC controls charging and discharging between the full-up node Q and the full-down node QB. The node controller NC may include a full-up node controller NC_Q for controlling charging and discharging of the full-up node Q and a full-down node controller NC_QB for controlling charging and discharging of the full-down node QB. The full-up node controller NC_Q includes at least one transistor TQ for controlling the full-up node Q, and the full-down node controller NC_QB includes at least one transistor TQB for controlling the full-down node QB.

The output of the gate signal Vout may be stably controlled by the node controller NC. Here, the node controller NC discharges the full-down node QB to a gate low voltage when the full-up node Q is charged with a gate high voltage, and discharges the full-up node Q to a gate low voltage when the full-down node QB is charged with a gate high voltage.

Therefore, when the start signal Vst is applied, the full-up node Q is charged with a gate high voltage and the full-down node QB is discharged with a gate low voltage by the operation of the plurality of transistors TQ and TQB provided in the node controller NC, thereby outputting the high source voltage VDD as the gate signal Vout. In addition, when a discharge signal VQB is applied, the full-up node Q is charged with a gate low voltage and the full-down node QB is charged with a gate high voltage by the operation of the plurality of transistors TQ and TQB provided in the node controller NC to output a low power voltage VSS as a gate signal Vout.

Figure 13:
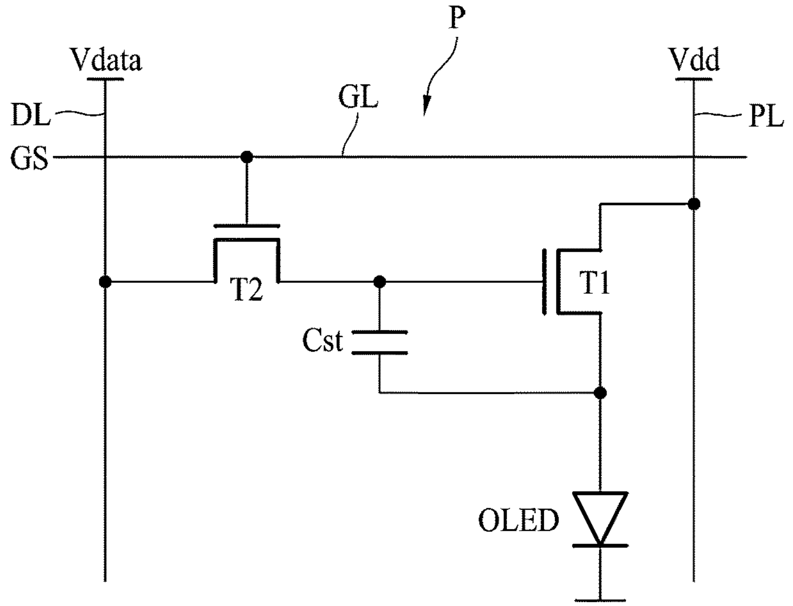
FIG. 13 is a circuit diagram of one pixel provided in a display apparatus according to an embodiment of the present disclosure.

FIG. 13 is a circuit diagram of one pixel provided in a display apparatus according to an embodiment of the present disclosure.

As shown in FIG. 13, the display apparatus according to an embodiment of present disclosure includes first to second thin film transistors T1 and T2 and capacitors Cst. The first thin film transistor T1 is a driving thin film transistor, and the second thin film transistor T2 is a switching thin film transistor. At least one of the first thin film transistor T1 and the second thin film transistor T2 may be formed of the above-described various thin film transistors.

The first thin film transistor T1 is switched according to the data voltage Vdata supplied from the second thin film transistor T2, generates a data current from the driving voltage VDD supplied from the power line PL, and supplies it to the organic light emitting diode OLED. The second thin film transistor T2 is switched according to the gate signal GS supplied to the gate line GL and supplies the data voltage Vdata supplied from the data line DL to the first thin film transistor T1.

The capacitor Cst serves to maintain the data voltage supplied to the first thin film transistor T1 for one frame, and is provided between the gate electrode and the source electrode of the first thin film transistor T1. The organic light emitting diode OLED emits predetermined light according to a data current supplied from the first thin film transistor T1.

Figure 14:
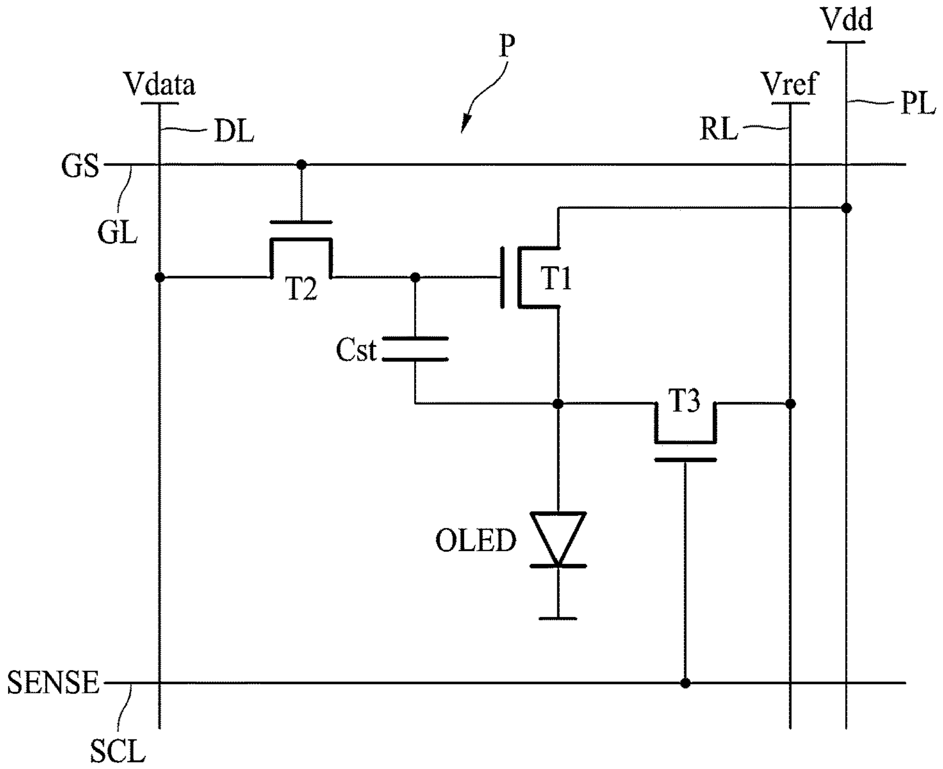
FIG. 14 is a circuit diagram of one pixel provided in a display apparatus according to another embodiment of the present disclosure.

FIG. 14 is a circuit diagram of one pixel provided in a display apparatus according to another embodiment of the present disclosure.

As shown in FIG. 14, the display apparatus according to another embodiment of present disclosure includes first to third thin film transistors T1, T2, T3 and a capacitor Cst. The first thin film transistor T1 is a driving thin film transistor, and the second to third thin film transistors T2 to T3 are switching thin film transistors. At least one of the first to third thin film transistors T1, T2, and T3 may be formed of the above-described various thin film transistors.

The first thin film transistor T1 is switched according to the data voltage Vdata supplied from the second thin film transistor T2, generates a data current from the driving voltage VDD supplied from the power line PL, and supplies it to the organic light emitting diode OLED. The second thin film transistor T2 is switched according to the gate signal GS supplied to the gate line GL and supplies the data voltage Vdata supplied from the data line DL to the first thin film transistor T1. The third thin film transistor T3 supplies the current of the first thin film transistor T1 to the reference line RL in response to the sensing control signal SENSE supplied from the scan line SCL. A reference voltage Vref is supplied to the reference line RL.

The capacitor Cst serves to maintain the data voltage supplied to the first thin film transistor T1 for one frame, and is provided between the gate electrode and the source electrode of the first thin film transistor T1. The organic light emitting diode OLED emits predetermined light according to a data current supplied from the first thin film transistor T1.

Figure 15:
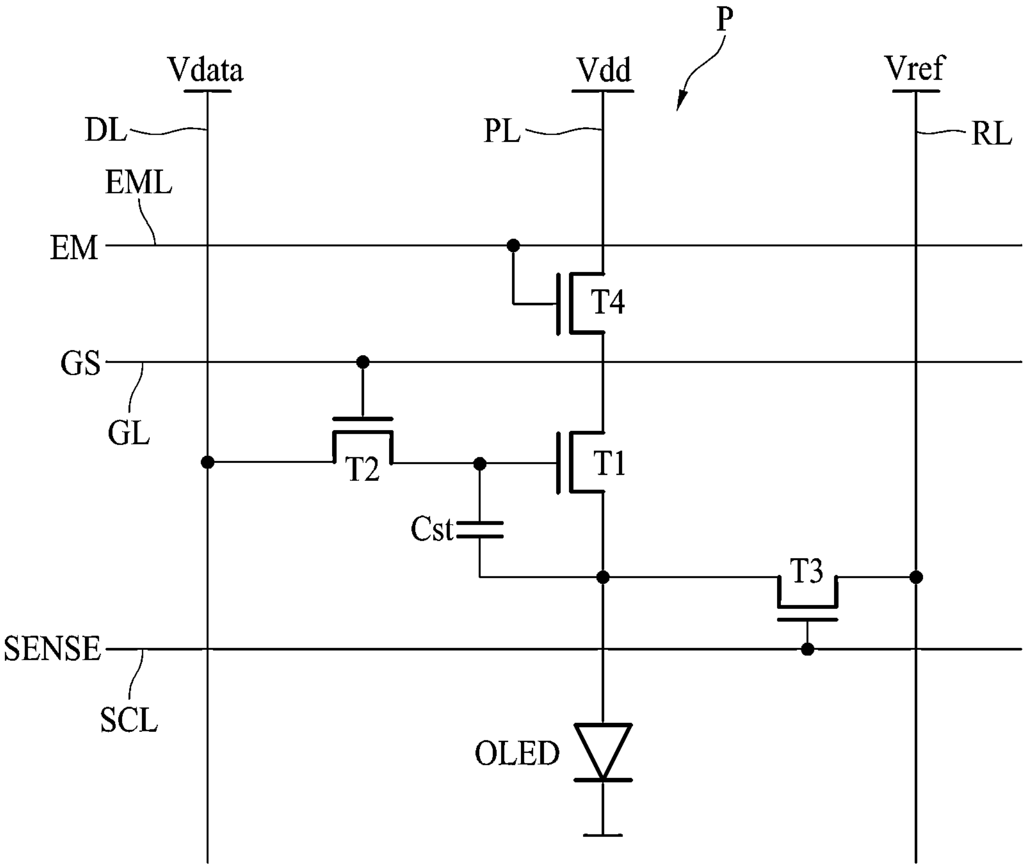
FIG. 15 is a circuit diagram of one pixel provided in a display apparatus according to another embodiment of the present disclosure.

FIG. 15 is a circuit diagram of one pixel provided in a display apparatus according to another embodiment of the present disclosure.

As shown in FIG. 15, the display apparatus according to another embodiment of the present disclosure includes first to fourth thin film transistors T1, T2, T3, and T4 and a capacitor Cst.

The first thin film transistor T1 is a driving thin film transistor, and the second to fourth thin film transistors T2 to T4 are switching thin film transistors. At least one of the first to fourth thin film transistors T1, T2, T3, and T4 may be formed of the above-described various thin film transistors.

The first thin film transistor T1 is switched according to the data voltage Vdata supplied from the second thin film transistor T2, generates a data current from the driving voltage VDD supplied from the power line PL, and supplies it to the organic light emitting diode OLED. The second thin film transistor T2 is switched according to the gate signal GS supplied to the gate line GL and supplies the data voltage Vdata supplied from the data line DL to the first thin film transistor T1. The third thin film transistor T3 supplies the current of the first thin film transistor T1 to the reference line RL in response to the sensing control signal SENSE supplied from the scan line SCL. A reference voltage Vref is supplied to the reference line RL. The fourth thin film transistor T4 is switched according to the light emission control signal EM supplied to the light emission control line EML and supplies the driving voltage VDD supplied from the power line PL to the first thin film transistor T1.

The capacitor Cst serves to maintain the data voltage supplied to the first thin film transistor T1 for one frame, and is provided between the gate electrode and the source electrode of the first thin film transistor T1. The organic light emitting diode OLED emits predetermined light according to a data current supplied from the first thin film transistor T1.

Accordingly, the present disclosure may have, for example, the following advantages.

According to an embodiment of the present disclosure, because protrusions are provided on one side and the other side of the gate electrode in the thin film transistor with top gate structure, an area in which an active layer overlapping the gate electrode is conductive may be controlled in a process of conducting the active layer.

According to an embodiment of the present disclosure, because an area in which the active layer is conductive may be controlled, even in the case of a thin film transistor having an active layer having a large width, a phenomenon in which the length of the channel becomes too short may be controlled.

According to an embodiment of the present disclosure, because an area in which the active layer is conductive may be controlled, a device having a not too short channel length may be reliably implemented in a large width active layer. For example, because the length of the channel is not too short, a thin film transistor substrate that implements the characteristics as designed may be provided.

According to an embodiment of the present disclosure, because the top gate thin film transistor has protrusions on one side and the other side of the gate electrode, and the active layer has active holes so as not to overlap the protrusions of the gate electrode, a region where the active layer overlaps the gate electrode can be controlled.

According to an embodiment of the present disclosure, because the conductive region inside the channel part is controlled through the protrusion of the gate electrode and the active hole of the active layer, the threshold voltage Vth of the thin film transistor having a wide channel can be prevented from being shifted in the negative (−) direction.

According to an embodiment of the present disclosure, because the threshold voltage Vth is prevented from being shifted in negative (−) direction, leakage current of the thin film transistor of the high mobile device can be prevented, and power consumption of a panel including the thin film transistor can be lowered. As a result, a low-power thin film transistor substrate may be produced.

It will be apparent to those skilled in the art that various modifications and variations can be made in the thin film transistor substrate and the display apparatus comprising the same of the present disclosure without departing from the technical idea or scope of the disclosure. Thus, it is intended that the present disclosure cover the modifications and variations of this disclosure provided they come within the scope of the appended claims and their equivalents.

What is claimed is:

1. A thin film transistor substrate, comprising:

a substrate;

an active layer on the substrate;

a gate electrode on the active layer;

a source electrode connected to a first side of the active layer; and a drain electrode connected to a second side of the active layer, wherein the active layer includes a channel area, a source area at a first side of the channel area, the source area being conductive and connected to the source electrode; and a drain area at a second side of the channel area, the drain area being conductive and connected to the drain electrode, wherein the gate electrode includes a body portion and at least one first protrusion on a first side of the body portion, the at least one first protrusion overlapping the source area in a plan view, and wherein the channel area has a plurality of first concave portions, and the source area has a plurality of first convex portions in a region corresponding to the plurality of first concave portions.

2. The thin film transistor substrate according to claim 1, wherein the plurality of first convex portions do not overlap the at least one first protrusion.

3. The thin film transistor substrate according to claim 1, wherein the plurality of first convex portions have a round shape.

4. The thin film transistor substrate according to claim 1, wherein the at least one first protrusion includes a plurality of first protrusions, and each of the plurality of first protrusions have a same shape.

5. The thin film transistor substrate according to claim 1, wherein the at least one first protrusion includes a plurality of first protrusions, and wherein a gap between adjacent ones the plurality of first protrusions is 0.5 μm or more, and 50 μm or less.

6. The thin film transistor substrate according to claim 1, wherein a length of the at least one first protrusion in a first direction is 0.5 μm or more, and 5 μm or less, wherein a length of the at least one first protrusion in a second direction is 0.5 μm or more, and 20 μm or less, wherein the first direction is a direction in which the source electrode and the drain electrode face each other, and wherein the second direction is perpendicular to the first direction.

7. The thin film transistor substrate according to claim 1, wherein the at least one first protrusion does not overlap the source electrode and the drain electrode.

8. The thin film transistor substrate according to claim 1, wherein the gate electrode further includes at least one second protrusion on a second side of the body portion, the at least one second protrusion overlapping the active layer.

9. The thin film transistor substrate according to claim 8, wherein the at least one first protrusion and at least one second protrusion are symmetrically disposed with respect to the body portion.

10. The thin film transistor substrate according to claim 8, wherein the at least one first protrusion overlaps the source area, and the at least one second protrusion overlaps the drain area.

11. The thin film transistor substrate according to claim 10, wherein the channel area includes a plurality of first concave portions and a plurality of second concave portions, wherein the source area includes a plurality of first convex portions in a region corresponding to the plurality of first concave portions, and wherein drain area includes a plurality of second convex portions in a region corresponding to the plurality of second concave portions.

12. The thin film transistor substrate according to claim 11, wherein the plurality of first convex portions and the plurality of second convex portions are symmetrically disposed with respect to the channel area.

13. The thin film transistor substrate according to claim 1, wherein the at least one first protrusion overlaps an edge in a length direction of the active layer, the length direction being a direction between the source area and the drain area.

14. A thin film transistor substrate, comprising:

a substrate;

an active layer on the substrate;

a gate electrode on the active layer;

a source electrode connected to a first side of the active layer; and a drain electrode connected to a second side of the active layer, wherein the gate electrode includes a body portion and at least one first protrusion on a first side of the body portion, the at least one first protrusion overlapping the active layer in a plan view, and wherein the active layer includes at least one active hole, and the at least one active hole does not overlap the at least one first protrusion.

15. The thin film transistor substrate according to claim 14, wherein a portion of the at least one active hole overlaps the body portion, and a remaining portion of the at least one active hole does not overlap the body portion.

16. The thin film transistor substrate according to claim 14, further comprising a gate insulating layer between the gate electrode and the active layer, wherein the gate insulating layer is inside the at least one active hole.

17. The thin film transistor substrate according to claim 15, further comprising an interlayer insulating layer between the source electrode and the active layer, wherein the interlayer insulating layer is inside the at least one active hole.

18. The thin film transistor substrate according to claim 14, further comprising an interlayer insulating layer between the source electrode and the active layer, wherein the interlayer insulating layer is disposed in an area where the at least one active hole overlaps the gate electrode.

19. The thin film transistor substrate according to claim 14, wherein the active hole includes a first active hole and a second active hole, and wherein the first active hole and the second active hole are symmetrically disposed with respect to the body portion.

20. The thin film transistor substrate according to claim 14, wherein the active layer includes a first active layer and a second active layer on the first active layer, and wherein the at least one active hole is formed only in the first active layer.

21. A thin film transistor substrate, comprising:

a substrate;

an active layer on the substrate;

a gate electrode on the active layer;

a source electrode connected to a first side of the active layer; and a drain electrode connected to a second side of the active layer, wherein the gate electrode includes a body portion and at least one first protrusion on a first side of the body portion, the at least one first protrusion overlapping the active layer in a plan view, wherein the active layer includes a channel area, wherein the channel area has a plurality of first concave portions, and wherein each first concave portion is spaced apart by a width of the first protrusion.

22. A thin film transistor substrate, comprising:

a substrate;

an active layer on the substrate;

a gate electrode on the active layer;

a source electrode connected to a first side of the active layer; and a drain electrode connected to a second side of the active layer, wherein the gate electrode includes a body portion and at least one first protrusion on a first side of the body portion, the at least one first protrusion overlapping the active layer in a plan view, wherein the active layer includes a channel area, wherein the channel area has a plurality of first concave portions and a plurality of second concave portions, wherein the plurality of first concave portions and the plurality of second concave portions are symmetrical disposed with respect to the channel area portion, and wherein the plurality of first concave portions and the plurality of second concave portions are formed of the same size.

* * * * *